US012476232B2

(12) United States Patent
Fujihara et al.

(10) Patent No.: US 12,476,232 B2
(45) Date of Patent: Nov. 18, 2025

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Mami Fujihara, Nakatsu Oita (JP); Kiyohisa Ichikawa, Buzen Fukuoka (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 466 days.

(21) Appl. No.: 17/899,456

(22) Filed: Aug. 30, 2022

(65) Prior Publication Data

US 2023/0123432 A1    Apr. 20, 2023

(30) Foreign Application Priority Data

Oct. 15, 2021 (JP) ................................. 2021-169282

(51) Int. Cl.
*H01L 25/16* (2023.01)
*H01L 23/00* (2006.01)
(Continued)

(52) U.S. Cl.
CPC ............ *H01L 25/167* (2013.01); *H01L 24/05* (2013.01); *H01L 24/48* (2013.01); *H10F 55/25* (2025.01);
(Continued)

(58) Field of Classification Search
None
See application file for complete search history.

(56) References Cited

U.S. PATENT DOCUMENTS 9,887,311 B2   2/2018   Kurosawa et al.
10,204,891 B2  2/2019   Okumura et al.
(Continued)

FOREIGN PATENT DOCUMENTS

JP    2017-147364 A   8/2017
JP       6371725 B2   8/2018
(Continued)

OTHER PUBLICATIONS

Notice of Reasons for Refusal (Office Action) dated Feb. 4, 2025 in corresponding Japanese Patent Application No. 2021-169282 with English machine translation (8 pages).

*Primary Examiner* — Sarah K Salerno
(74) *Attorney, Agent, or Firm* — Kim & Stewart LLP

(57) ABSTRACT

A semiconductor device includes an insulating member, a light-receiving element, a light-emitting element, a switching element, a metal reflection plate, a first resin member and a second resin member. The light-receiving element, the switching element and the metal reflection plate are provided on and arranged along a front surface of the insulating member. The switching element is electrically connected to the light-receiving element. The light-emitting element provided on the light-receiving element and optically coupled to the light-receiving element. The metal reflection plate is proximate to the light-receiving element. The first resin member covering the light-emitting element on the light-receiving element. The second resin member covering the light-receiving element, the light-emitting element, the first resin member, the switching element, and the metal reflection plate on the front surface of the insulating member.

13 Claims, 6 Drawing Sheets

(51) Int. Cl.
*H10F 55/25* (2025.01)
*H10F 77/50* (2025.01)

(52) U.S. Cl.
CPC .... *H10F 77/50* (2025.01); *H01L 2224/05554* (2013.01); *H01L 2224/48137* (2013.01); *H01L 2924/181* (2013.01)

(56) References Cited

U.S. PATENT DOCUMENTS

| | | |
|---|---|---|
| 11,094,681 B2 | 8/2021 | Saito et al. |
| 2021/0175221 A1* | 6/2021 | Tonedachi ........ H01L 23/49838 |

FOREIGN PATENT DOCUMENTS

| | | |
|---|---|---|
| JP | 2020-096105 A | 6/2020 |
| JP | 2021089971 A | 6/2021 |

* cited by examiner

SEMICONDUCTOR DEVICE

CROSS-REFERENCE TO RELATED APPLICATIONS

This application is based upon and claims the benefit of priority from Japanese Patent Application No. 2021-169282, filed on Oct. 15, 2021; the entire contents of which are incorporated herein by reference.

FIELD

Embodiments relate to a semiconductor device.

BACKGROUND

It is desirable for a semiconductor device to transmit a high-frequency signal by improving the frequency characteristics. A photo-relay, for example, includes a light-emitting element, a light-receiving element, and a switching element, in which the light-emitting element at an input side is optically coupled to the light-receiving element that controls the switching element at an output side. The photo-relay is used as the on-off controller of high frequency signals and is required to improve the transmission property of the high frequency signal by reducing the impedance between the output-side terminals. When the light-emitting element, the light-receiving element and the switching element are mounted at the front side of the substrate and the output-side terminals are provided at the backside of the substrate, the impedance between the output-side terminals can be reduced by, for example, reducing the thickness of the substrate.

DETAILED DESCRIPTION

Figure 1:
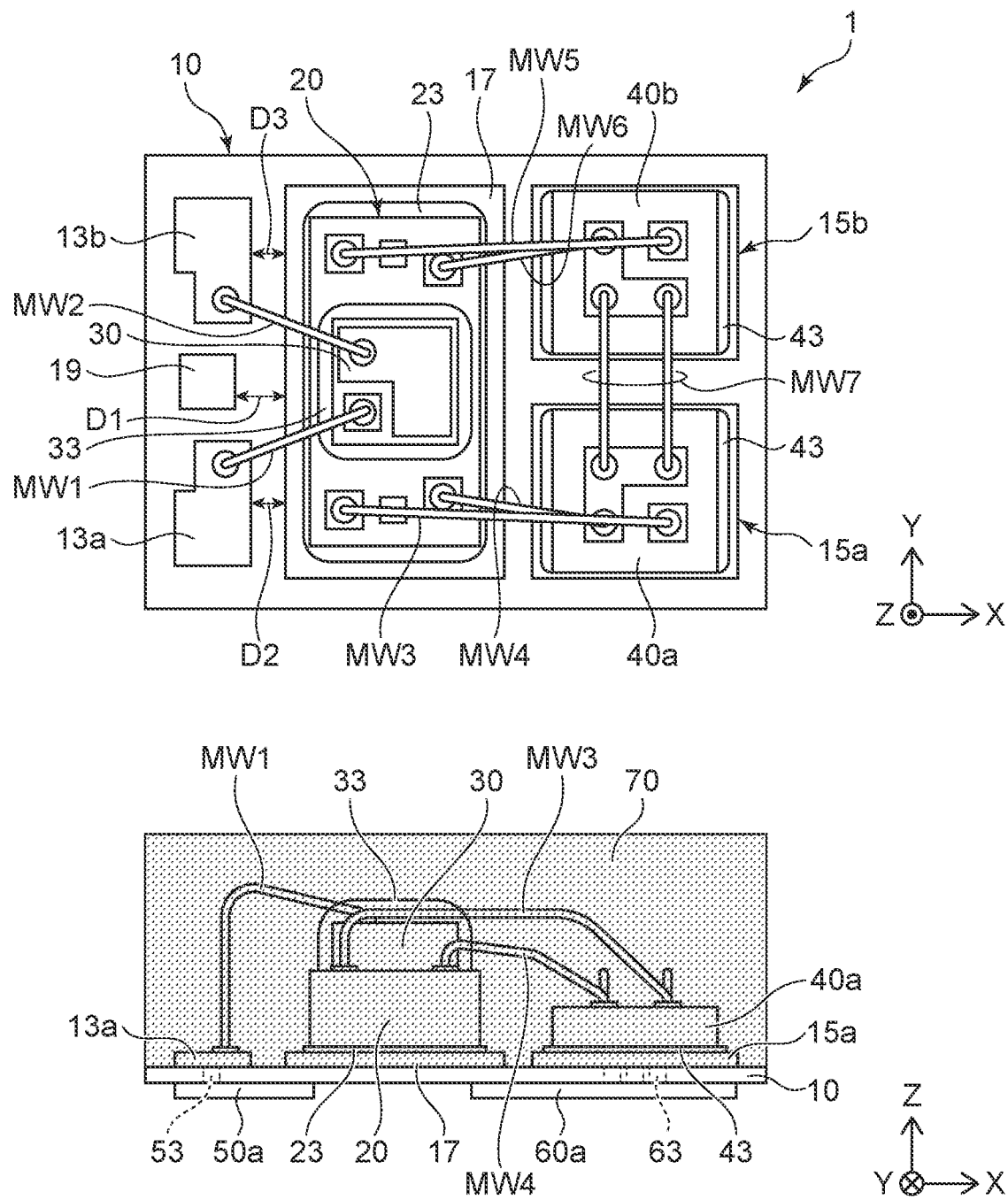
FIG. 1 is a schematic cross-sectional view showing the semiconductor device according to an embodiment.

According to one embodiment, a semiconductor device includes an insulating member, a light-receiving element, a light-emitting element, a switching element, a first metal terminal, a second metal terminal, a metal reflection plate, a first resin member, and a second resin member. The insulating member has a front surface and a back surface opposite to the front surface. The light-receiving element is provided on the front surface of the insulating member. The light-emitting element is provided on the light-receiving element and optically coupled to the light-receiving element. The switching element is provided on the front surface of the insulating member. The switching element and the light-receiving element are arranged along the front surface of the insulating member. The switching element is electrically connected to the light-receiving element. The first metal terminal is provided on the back surface of the insulating member and electrically connected to the light-emitting element. The second metal terminal is provided on the back surface of the insulating member and electrically connected to the switching element. The second metal terminal is apart from the first metal terminal. The metal reflection plate is provided on the front surface of the insulating member. The metal reflection plate is proximate to the light-receiving element. The first resin member covers the light-emitting element on the light-receiving element. The second resin member covers the light-receiving element, the light-emitting element, the first resin member, the switching element, and the metal reflection plate on the front surface of the insulating member.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

Figure 2:
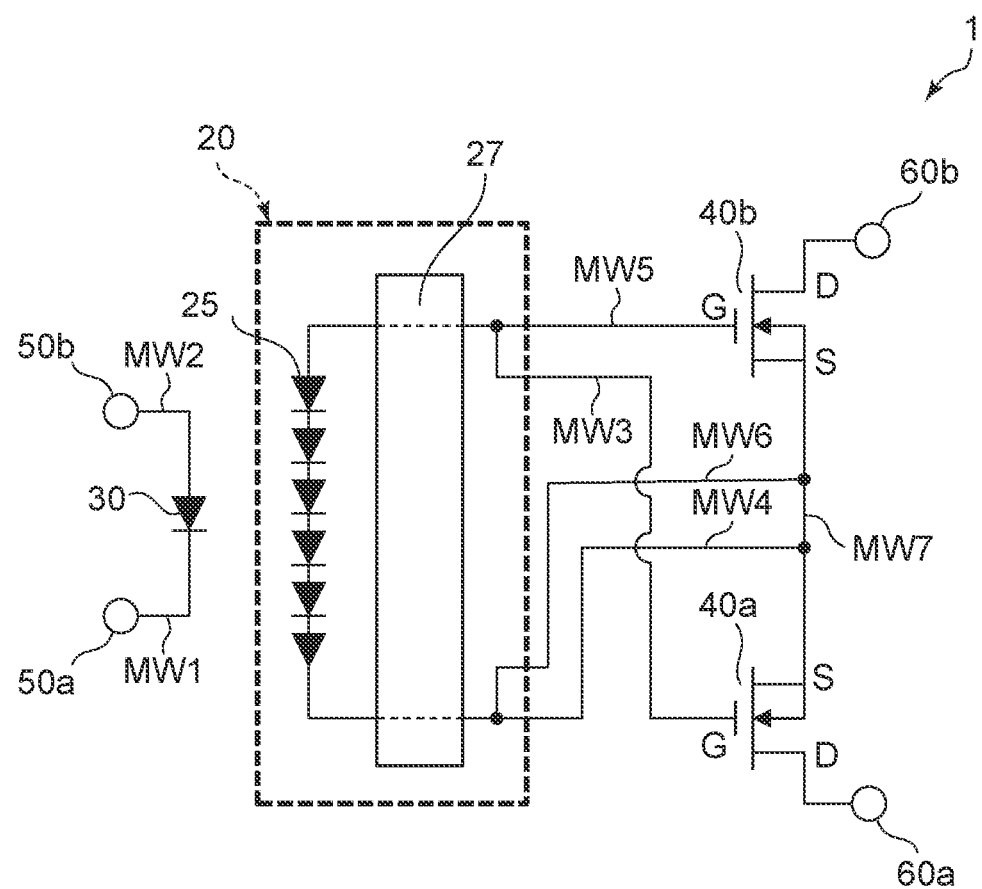
FIG. 2 is a circuit diagram showing the configuration of the semiconductor device according to the embodiment.

FIGS. 1 and 2 are schematic views illustrating a semiconductor device 1 according to an embodiment.

FIG. 1 is top and side views schematically showing the semiconductor device 1 according to the embodiment. FIG. 2 is a circuit diagram showing the configuration of the semiconductor device 1 according to the embodiment.

The semiconductor device 1 is, for example, a photo-relay. The semiconductor device 1 includes an insulating member 10, a light-receiving element 20, a light-emitting element 30, a switching element 40a, and a switching element 40b.

The insulating member 10 is, for example, an insulating resin sheet. The insulating member 10 includes, for example, polyimide. The thickness of the insulating member 10 in a direction from the back surface toward the front surface (the Z-direction) is, for example, 50 micrometers (μm).

On the front surface of the insulating member 10, for example, bonding pads 13a and 13b and mount pads 15a, 15b, and 17 are provided. The bonding pads 13a and 13b and the mount pads 15a, 15b, and 17 are, for example, metal layers that include copper. The thicknesses of the bonding pads 13a and 13b and the mount pads 15a, 15b, and 17 each are, for example, 30 μm in the Z-direction.

The bonding pad 13a and the bonding pad 13b are proximate to a mount pad 17 and are arranged in, for example, the Y-direction. The bonding pad 13a and the mount pad 17 are arranged in, for example, the X-direction. The bonding pad 13b and the mount pad 17 are arranged in, for example, the X-direction.

The mount pad 17, for example, is provided between the bonding pad 13a and the mount pad 15a and between the bonding pad 13b and a mount pad 15b.

The mount pad 15a and the mount pad 15b are arranged in, for example, the Y-direction. The bonding pad 13a and the mount pad 15a are arranged in, for example, the X-direction. The bonding pad 13b and the mount pad 15b are arranged in, for example, the X-direction.

On the back surface of the insulating member 10 (see FIG. 3D), control-side terminals 50a and 50b and output-side terminals 60a and 60b are provided. The control-side terminals 50a and 50b and the output-side terminals 60a and 60b are, for example, metal layers that include copper. The thicknesses of the control-side terminals 50a and 50b and the output-side terminals 60a and 60b each are, for example, 30 μm in the Z-direction.

Figure 3A:
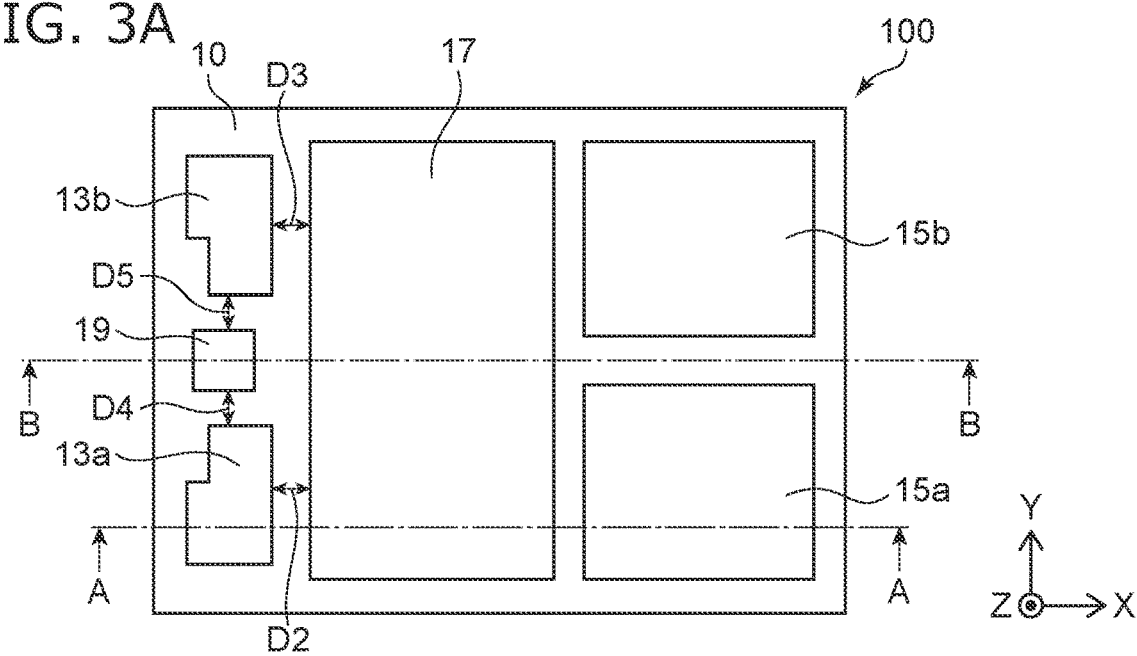
FIGS. 3A to 3D are schematic views showing a base member of the semiconductor device according to the embodiment.
Figure 3B:
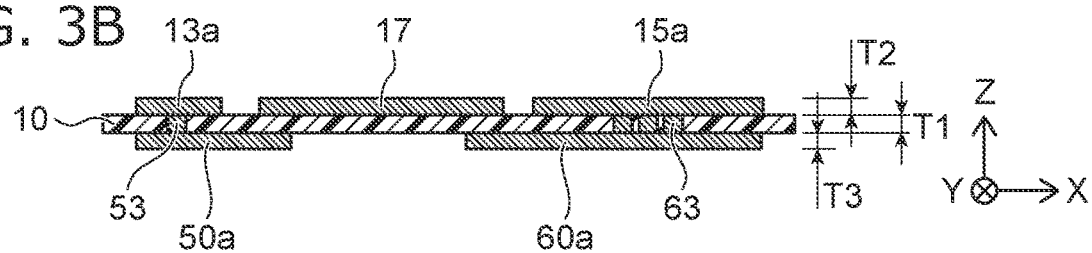

The control-side terminal 50a faces the bonding pad 13a via the insulating member 10 (see FIG. 3B). The control-side terminal 50a is electrically connected to the bonding pad 13a by a via contact 53 provided in the insulating member 10. The via contact 53 includes, for example, the same material as the control-side terminal 50a. The via contact 53 includes, for example, copper. Other via contacts shown below also are similarly provided.

The control-side terminal 50b faces the bonding pad 13b via the insulating member 10. The control-side terminal 50b is electrically connected to the bonding pad 13b by a via contact (not-illustrated).

The output-side terminal 60a faces the mount pad 15a via the insulating member 10 (see FIG. 3B). The output-side terminal 60a is electrically connected to the mount pad 15a by a via contact 63 provided in the insulating member 10. The output-side terminal 60a is electrically connected to the mount pad 15a by, for example, multiple via contacts 63.

The output-side terminal 60b faces the mount pad 15b via the insulating member 10. The output-side terminal 60b is electrically connected to the mount pad 15b by a via contact (not-illustrated).

The light-receiving element 20 is mounted on the mount pad 17 via a connection member 23. The connection member 23 is, for example, a solder material or a conductive paste. The connection member 23 may be a non-conductive paste. The light-emitting element 30 is mounted on the light-receiving element 20 via, for example, a transmissive connection member 35 (see FIG. 4A). The light-emitting element 30 is optically coupled to the light-receiving element 20. The light-receiving element 20 includes, for example, a silicon photodiode. The light-emitting element 30 is, for example, a light-emitting diode (LED).

The switching elements 40a and 40b are mounted respectively on the mount pads 15a and 15b via connection members 43. The connection members 43 are, for example, solder materials or conductive pastes.

The switching elements 40a and 40b each are, for example, vertical MOSFET that includes a drain at the backside and a source at the front side. The switching elements 40a and 40b are mounted so that the back surfaces of the switching elements 40a and 40b respectively face the mount pads 15a and 15b. The switching element 40a is electrically connected to the output-side terminal 60a via the mount pad 15a and the via contact 63. The switching element 40b is electrically connected to the output-side terminal 60b (see FIG. 3D) via the mount pad 15b and a via contact (not illustrated).

As shown in FIG. 1, the light-receiving element 20 is electrically connected to the switching elements 40a and 40b via metal wires MW3 to MW6 (see FIG. 2). The switching element 40a and the switching element 40b are electrically connected via a metal wire MW7 (see FIG. 2).

The light-emitting element 30 is electrically connected to the bonding pads 13a and 13b respectively via metal wires MW1 and MW2. The light-emitting element 30 is electrically connected to the control-side terminal 50a via the bonding pad 13a and the via contact 53. Also, the light-emitting element 30 is electrically connected to the control-side terminal 50b (see FIG. 3D) via the bonding pad 13b and a via contact (not illustrated).

Figure 5A:
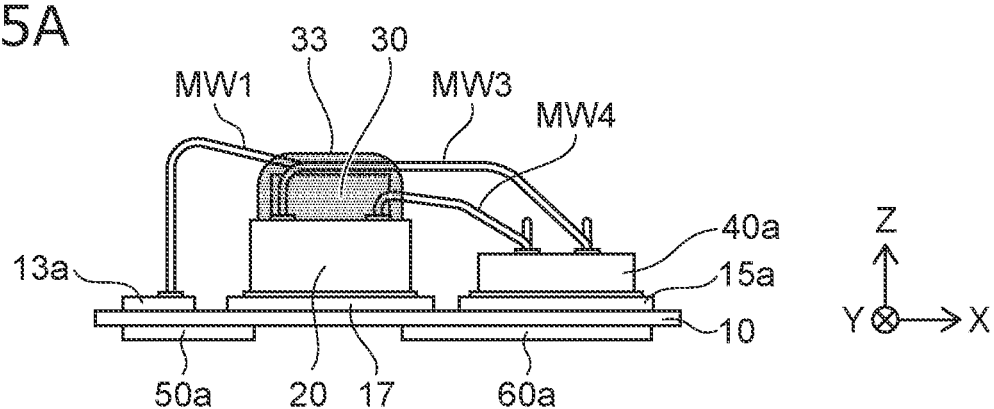

The light-emitting element 30 is sealed on the light-receiving element 20 with a resin member 33 (see FIG. 5A). The resin member 33 is, for example, silicone. A resin member 70 also is provided at the front side of the insulating member 10. The resin member 70 is, for example, an epoxy resin. The resin member 70 is, for example, non-transmissive. The resin member 70 seals the light-receiving element 20, the light-emitting element 30, the switching elements 40a and 40b, and the metal wires MW on the insulating member 10. The resin member 70 covers the resin member 33.

Thus, the semiconductor device 1 has a structure in which the light-receiving element 20, the light-emitting element 30, and the switching elements 40a and 40b are sealed inside the resin package; and the control-side terminals 50a and 50b and the output-side terminals 60a and 60b are at the outer surface of the resin package that includes the insulating member 10 and the resin member 70.

The semiconductor device 1 further includes a metal reflection plate 19 provided on the front surface of the insulating member 10. The metal reflection plate 19 is provided at a position proximate to the light-receiving element 20. The metal reflection plate 19, for example, is provided proximate to the mount pad 17. The metal reflection plate 19 is provided, for example, between the bonding pads 13a and 13b. The bonding pads 13a and 13b and the metal reflection plate 19 are apart from each other and apart from the mount pad 17.

A first separation distance D1 from the mount pad 17 to the metal reflection plate 19 is, for example, greater than a second separation distance D2 from the mount pad 17 to the bonding pad 13a. Also, the first separation distance D1 is, for example, greater than a third separation distance D3 from the mount pad 17 to the bonding pad 13b. In other words, the metal reflection plate 19 is apart from the metal wires MW1 and MW2 in a plan view parallel to the front surface of the insulating member 10. Thereby, interference between laser light LL and the metal wires MW1 and MW2 can be prevented in the process of sealing the light-emitting element 30 with the resin member 33 (see FIG. 4C).

The metal reflection plate 19 is apart from the outer edge of the insulating member 10 in an inward direction in a plan view parallel to the front surface of the insulating member 10. Thereby, it is possible to prevent the end surface of the metal reflection plate 19 from being exposed at the side surface of the resin member 70.

In the semiconductor device 1, the resin member 70 contacts the insulating member 10 between the pads and at the outer edge of the insulating member 10. The adhesion between the insulating member 10 and the resin member 70 is improved, thereby, increasing the reliability of the light-receiving element 20, the light-emitting element 30, and the switching elements 40a and 40b that are sealed with the resin member 70. Also, it is possible to prevent metal other than the control-side terminals 50a and 50b and the output-side terminals 60a and 60b from being exposed at the outer surface of the resin package including the insulating member 10 and the resin member 70. When mounting the semiconductor device 1 using a connection member such as a solder cream or the like, it is possible to prevent the connection member from penetrating into the resin package due to capillary action, creeping up of the solder material, etc.

As shown in FIG. 2, the light-receiving element 20 includes multiple photodiodes 25 and a control circuit 27. The multiple photodiodes 25 are connected in series. The photodiode 25 is configured to detect the light of the light-emitting element 30. The control circuit 27 is, for example, a waveform shaping circuit. The control circuit 27 may be a discharging circuit, a protection circuit, etc. The output of the photodiode 25 is output via the control circuit 27.

A source S of the switching element 40a is connected to a source S of the switching element 40b. The cathode-side output of the photodiode 25 is connected to, for example, the sources S of the switching elements 40a and 40b via the control circuit 27. The anode-side output of the photodiode 25 is connected to, for example, gates G of the switching elements 40a and 40b via the control circuit 27. The output-side terminal 60a is connected to a drain D of the switching element 40a; and the output-side terminal 60b is connected to a drain D of the switching element 40b.

A control signal is input to the control-side terminals 50a and 50b, which performs, for example, an on-off control of the conduction between the output-side terminal 60a and the output-side terminal 60b. The light-emitting element 30 radiates an optical signal corresponding to the control signal; and the light-receiving element 20 detects the optical signal radiated from the light-emitting element 30 and outputs a control signal corresponding to the optical signal to the switching elements 40a and 40b.

It is desirable for the semiconductor device 1 to improve, for example, the transmission characteristics of the high-frequency signal when performing the on-off control of the transmission path between the output-side terminal 60a and the output-side terminal 60b. In the semiconductor device 1, the impedance can be reduced between the switching element 40a and the output-side terminal 60a and between the switching element 40b and the output-side terminal 60b by reducing the Z-direction thickness of the insulating member 10. Thereby, the transmission characteristics of the high-frequency signal can be improved between the output-side terminal 60a and the output-side terminal 60b.

FIGS. 3A to 3D are schematic views showing a base member 100 of the semiconductor device 1 according to the embodiment. The base member 100 includes the insulating member 10, the bonding pads 13a and 13b, the mount pads 15a, 15b, and 17, the metal reflection plate 19, the control-side terminals 50a and 50b, and the output-side terminals 60a and 60b. The light-receiving element 20, the light-emitting element 30, and the switching elements 40a and 40b are mounted at the front side of the base member 100 (see FIG. 1).

FIG. 3A is a plan view showing the front side of the insulating member 10. The bonding pads 13a and 13b, the mount pads 15a, 15b, and 17, and the metal reflection plate 19 are formed by, for example, patterning a copper foil provided on the front surface of the insulating member 10. The bonding pads 13a and 13b, the mount pads 15a, 15b, and 17, and the metal reflection plate 19 may have a stacked structure that includes, for example, multiple plating layers. It is favorable to provide a gold (Au) layer at the outermost surface of the metal reflection plate 19 for oxidation prevention.

The bonding pads 13a and 13b are arranged in the Y-direction. The mount pads 15a and 15b are arranged in the Y-direction. The mount pad 17 is provided between the bonding pad 13a and the mount pad 15a and between the bonding pad 13b and the mount pad 15b. The embodiment is not limited to this arrangement.

The metal reflection plate 19 is provided between the bonding pads 13a and 13b. The metal reflection plate 19 is apart from the bonding pads 13a and 13b. The metal reflection plate 19 is greater than, for example, the spot diameter of the laser light LL used when providing the resin member 33 (see FIG. 4C). The size of the metal reflection plate 19 is, for example, 200 μm in the X-direction and the Y-direction.

The separation distances from each other of the bonding pads 13a and 13b and the mount pads 15a, 15b, and 17 are preferably as short as possible to downsize the semiconductor device 1. The second separation distance D2 between the bonding pad 13a and the mount pad 17 and the third separation distance D3 between the bonding pad 13b and the mount pad 17 are, for example, the minimum line width when patterning the copper foil on the insulating member 10. The second separation distance D2 and the third separation distance D3 are, for example, 100 μm.

A fourth separation distance D4 between the bonding pad 13a and the metal reflection plate 19 is not less than the second separation distance D2. A fifth separation distance D5 between the bonding pad 13b and the metal reflection plate 19 is not less than the third separation distance D3. To avoid interference between the laser light LL and the metal wires MW1 and MW2 (see FIG. 1), it is favorable for the fourth separation distance D4 to be greater than the second separation distance D2 and for the fifth separation distance D5 to be greater than the third separation distance D3.

From the viewpoint of downsizing the semiconductor device 1, the distance in the X-direction from the metal reflection plate 19 to the outer edge of the insulating member 10 is preferably equal to or greater than the distances in the X-direction from the bonding pads 13a and 13b to the outer edge of the insulating member 10.

FIG. 3B is a cross-sectional view along line A-A shown in FIG. 3A. The insulating member 10 has, for example, a thickness T1 in the Z-direction. The bonding pads 13a and 13b and the mount pads 15a, 15b, and 17 each have a thickness T2 in the Z-direction. The control-side terminals 50a and 50b and the output-side terminals 60a and 60b that are provided on the back surface of the insulating member 10 each have a thickness T3 in the Z-direction. From the viewpoint of simplifying the manufacturing processes and stabilizing the manufacturing quality, T2 and T3 is substantially equal to, and preferably less than T1.

The via contact 53 and the via contact 63 are provided in the insulating member 10. The via contacts 53 and 63 are provided, for example, inside via holes that communicate from the backside to the front side of the insulating member 10. The via contacts 53 and 63 are formed to fill the via holes with a metal such as copper and like by, for example, plating.

The control-side terminal 50a is electrically connected to the bonding pad 13a by the via contact 53. The output-side terminal 60a is electrically connected to the mount pad 15a by the via contact 63. Similarly, the control-side terminal 50b and the output-side terminal 60b are electrically connected to the bonding pad 13b and the mount pad 15b, respectively, by via contacts.

Figure 3C:
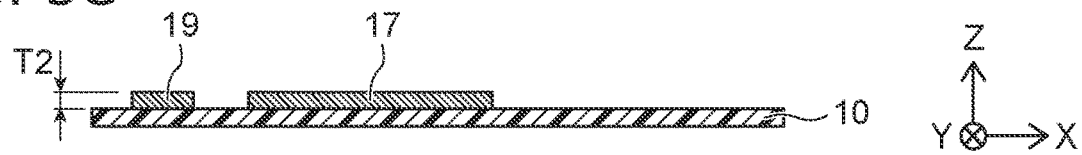

FIG. 3C is a cross-sectional view along line B-B shown in FIG. 3A. The metal reflection plate 19 has the same thickness T2 in the Z-direction as the mount pad 17. The metal reflection plate 19 is electrically insulated from the bonding pads 13a and 13b, the mount pads 15a, 15b, and 17, the control-side terminals 50a and 50b, and the output-side terminals 60a and 60b. Although the embodiment is not limited to the example, it is preferable for the metal reflection plate 19 to have a floating potential from the viewpoint of improving the high-frequency characteristics.

Figure 3D:
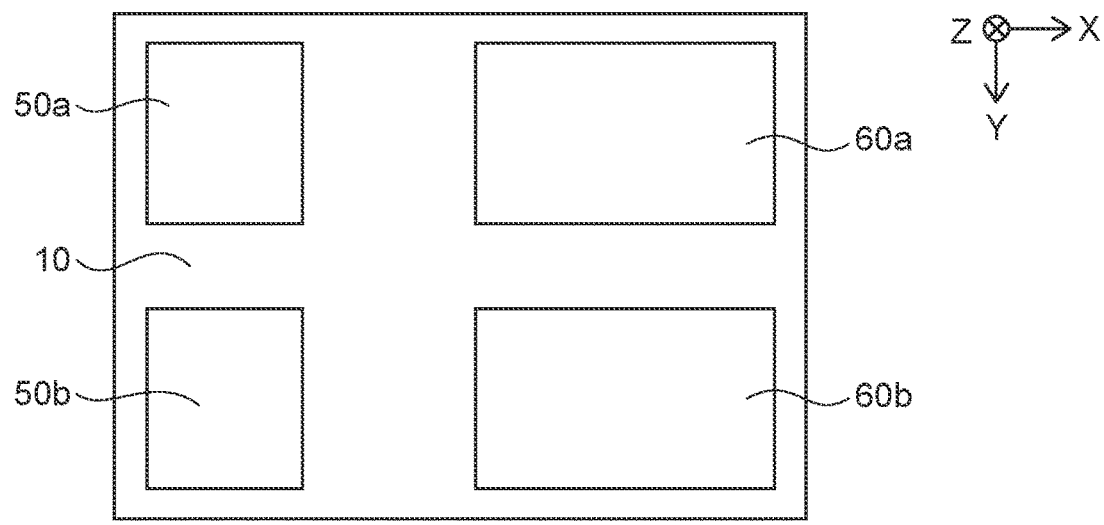

FIG. 3D is a plan view showing the control-side terminals 50a and 50b and the output-side terminals 60a and 60b provided at the backside of the insulating member 10. The control-side terminals 50a and 50b and the output-side terminals 60a and 60b are formed by, for example, patterning a copper foil provided on the back surface of the insulating member 10. The control-side terminal 50b and the output-side terminal 60b have the same thickness T3 in the Z-direction as the control-side terminal 50a and the output-side terminal 60a. The control-side terminals 50a and 50b and the output-side terminals 60a and 60b may have a stacked structure, for example, in which a gold (Au) layer is provided at the surface for oxidation prevention.

The control-side terminals 50a and 50b are arranged in, for example, the Y-direction. The output-side terminals 60a and 60b are arranged in, for example, the Y-direction. The control-side terminal 50a and the output-side terminal 60a are arranged in, for example, the X-direction. The control-side terminal 50b and the output-side terminal 60b are arranged in, for example, the X-direction.

The control-side terminal 50a faces the bonding pad 13a via the insulating member 10. The control-side terminal 50b faces the bonding pad 13b via the insulating member 10.

The output-side terminal 60a faces the mount pad 15a via the insulating member 10. The output-side terminal 60b faces the mount pad 15b via the insulating member 10.

The thickness T1 of the insulating member 10 is preferably thin to reduce the impedance between the switching element 40a and the output-side terminal 60a and the impedance between the switching element 40b and the output-side terminal 60b.

The bonding pads 13a and 13b have thicknesses, for example, that can ensure the bonding strength of the metal wires MW1 and MW2 (see FIG. 1). Accordingly, the thickness T2 in the Z-direction of the bonding pads 13a and 13b provided at the front side of the insulating member 10 is preferably greater than a prescribed thickness that can ensure the bonding strength.

The thickness T3 of the control-side terminals 50a and 50b and the output-side terminals 60a and 60b provided at the backside of the insulating member 10 is preferably equal to the thickness T2 of the bonding pads 13a and 13b and the mount pads 15a, 15b, and 17 to balance the stress applied to the insulating member 10. Here, "same" or "equal" means not only an exact match, but also includes substantially the same or equal.

The thickness T1 of the insulating member 10 is preferably less than the combined thickness (T2+T3) of the thickness T2 of the bonding pads 13a and 13b and the mount pads 15a, 15b, and 17 and the thickness T3 of the control-side terminals 50a and 50b and the output-side terminals 60a and 60b. Thereby, the impedance can be reduced between the switching element 40a and the output-side terminal 60a and between the switching element 40b and the output-side terminal 60b. The thickness T1 of the insulating member 10 is, for example, 50 μm. The thickness T2 and the thickness T3 each are, for example, 30 μm.

A method for manufacturing the semiconductor device 1 will now be described with reference to FIGS. 4A to 5B. FIGS. 4A to 5B are schematic views showing manufacturing processes of the semiconductor device 1 according to the embodiment.

Figure 4A:
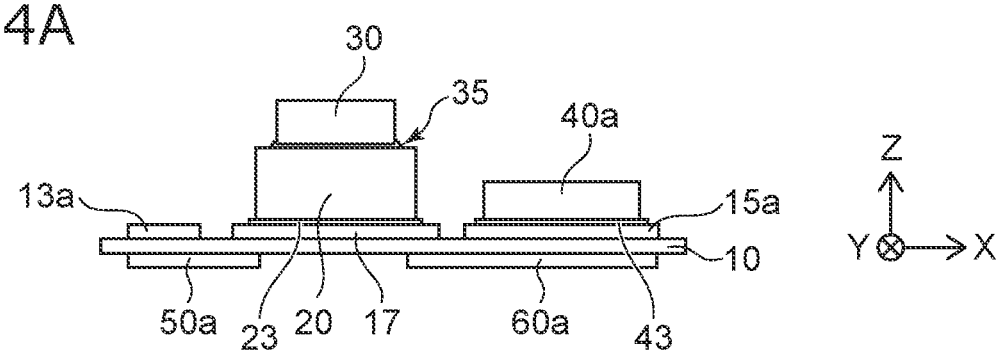
FIGS. 4A to 5B are schematic views showing manufacturing processes of the semiconductor device according to the embodiment.

As shown in FIG. 4A, the switching element 40a and the light-receiving element 20 are mounted respectively on the mount pads 15a and 17 provided on the insulating member 10. The switching element 40a and the light-receiving element 20 are placed on the mount pads 15a and 17 via, for example, a solder cream or a conductive paste, and are fixed by reflow or curing. The switching element 40b is mounted on the mount pad 15b (not-illustrated).

Also, the light-emitting element 30 is mounted on the light-receiving element 20. The light-emitting element 30 is bonded to, for example, the light-receiving element 20 via the connection member 35. The light-emitting element 30 radiates light toward the light-receiving element 20 from the back surface facing the light-receiving element 20. The connection member 35 is, for example, a transparent resin layer that transmits the light radiated by the light-emitting element 30.

Figure 4B:
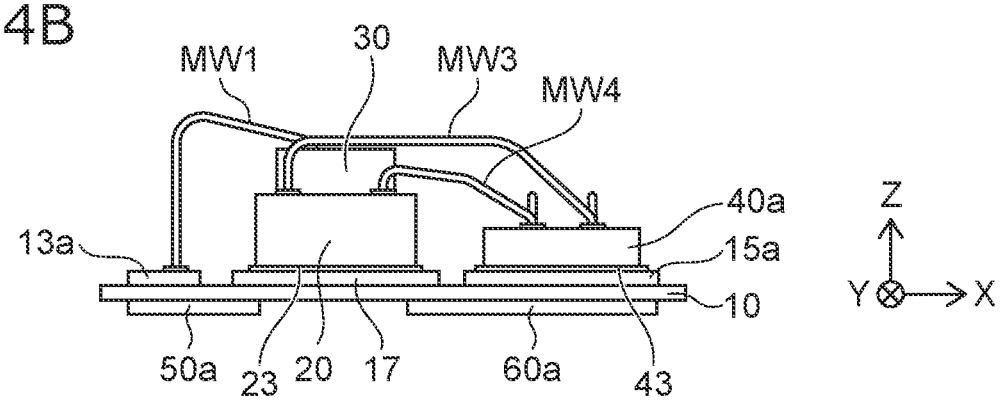

As shown in FIG. 4B, the metal wire MW1 electrically connects the bonding pad 13a and the light-emitting element 30 (see FIG. 2). The metal wires MW3 and MW4 electrically connect the light-receiving element 20 and the switching element 40a (see FIG. 2). The metal wires MW1, MW3, and MW4 are connected on the electrodes of the semiconductor elements by, for example, ultrasonic bonding.

Also, at not-illustrated portions, other metal wires are electrically connected respectively between the bonding pad 13b and the light-emitting element 30, between the light-receiving element 20 and the switching element 40b, and between the switching element 40a and the switching element 40b (see FIG. 1).

Figure 4C:
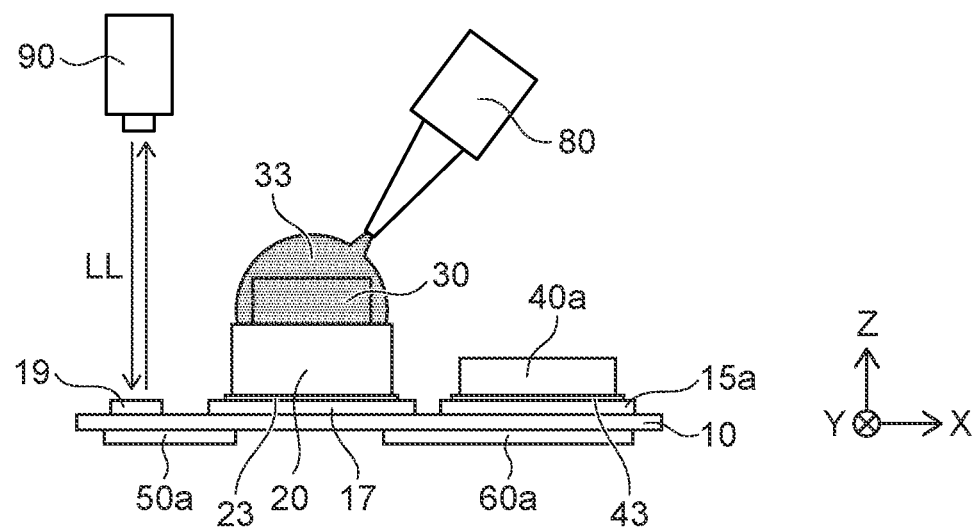

As shown in FIG. 4C, the resin member 33 is supplied onto the light-receiving element 20 and the light-emitting element 30 to cover the light-emitting element 30. The bonding pad 13a and the metal wires MW1, MW3, and MW4 are not illustrated in FIG. 4C. The resin member 33 is, for example, a silicone resin.

The resin member 33 is supplied using a so-called potting device (not illustrated). The potting device includes, for example, a nozzle 80 and a laser sensor 90. The nozzle 80 dispenses the resin member 33. The laser sensor 90 detects, for example, the displacement of the height (the Z-direction) of the front surface of the insulating member 10 via the metal reflection plate 19 using the laser light LL.

When sealing the light-emitting element 30 on the light-receiving element 20 by the resin member 33, it is desirable to precisely control the amount of the resin member 33 supplied from the nozzle 80. If the resin member 33 is supplied more than the appropriate amount, the resin member 33 outflows along the side surface of the light-receiving element 20. Therefore, the light-receiving element 20 is incompletely sealed with the resin member 70, and may cause degradation of the reliability. When the resin member 33 is less than the appropriate amount, the light-emitting element 30 also is incompletely sealed, and degrades the reliability.

The supply amount of the resin member 33 is dependent on the distance between the light-emitting element 30 and the tip of the nozzle 80. Accordingly, to provide the appropriate supply amount of the resin member 33, it is important to maintain a constant distance from the front surface of the insulating member 10 to the nozzle 80. In the example, the laser light LL is irradiated on the metal reflection plate 19, and the displacement of the front surface of the insulating member 10 in the Z-direction is monitored by detecting the reflection of the laser light LL. By feeding back the displacement of the front surface of the insulating member 10 to the position of the nozzle 80, it is possible to maintain the constant distance from the front surface of the insulating member 10 to the nozzle 80.

As shown in FIG. 5A, the light-emitting element 30 is sealed with the resin member 33 on the light-receiving element 20. The resin member 33 is, for example, a gel that relaxes the stress applied to the light-emitting element 30. The reliability of the light-emitting element 30 is increased thereby.

Figure 5B:
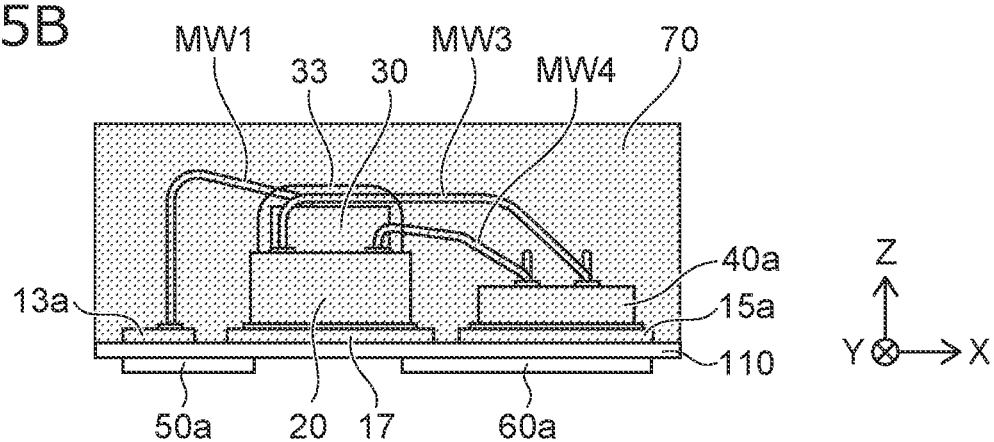

As shown in FIG. 5B, the resin member 70 is molded at the front side of the insulating member 10. The resin member 70 is, for example, an epoxy resin. The insulating member 10 and the resin member 70 house the light-receiving element 20, the light-emitting element 30, the switching element 40a, and the switching element 40b as, for example, a resin package. The control-side terminals 50a and 50b and the output-side terminals 60a and 60b are exposed at, for example, the bottom surface of the resin package.

In the manufacturing processes shown in FIGS. 4A to 5B, a sheet-like insulating member 10 with a wide surface area is used, and the multiple semiconductor devices 1 are collectively formed. In the semiconductor device 1, by reducing the Z-direction thickness of the insulating member 10, the impedance is reduced between the output-side terminals 60a and 60b. Therefore, the insulating member 10 is easily deflected; and it is difficult to maintain a uniform height of the front surface of the insulating member 10. Also, it is difficult to include a member that reflects the laser light LL in the thin insulating member 10. Therefore, the reflection amount is low even when the laser light LL is directly irradiated on the front surface of the insulating member 10; and it is difficult to accurately monitor the displacement of the front surface of the insulating member 10.

In the semiconductor device 1 according to the embodiment, the surface displacement of the insulating member 10 can be accurately monitored by providing the metal reflection plate 19 on the front surface of the insulating member 10. By providing the metal reflection plate 19 proximate to the mount pad 17, the positional accuracy of the nozzle 80 can be drastically improved. Thereby, the supply amount of the resin member 33 can be maintained at the appropriate amount, and it is possible to increase the manufacturing yield of the semiconductor device 1.

There are also cases where the insulating member 10 is deformed by heat effects in the manufacturing processes, e.g., by the temperature raised in the bonding process of the metal wires MW1 to MW7. In the semiconductor device 1 according to the embodiment, by providing the metal reflection plate 19 between the bonding pad 13a and the bonding pad 13b, the local deformation of the insulating member 10 proximate to the mount pad 17 can be suppressed. The relative displacement in the Z-direction between the metal reflection plate 19 and the mount pad 17 can be suppressed thereby, and the positional accuracy of the nozzle 80 can be further increased.

Further, it is possible to suppress the deformation of the insulating film 10 by providing the mount pad 17 on the portions of the control-side terminals 50a and 50b and the portions of the output-side terminals 60a and 60b in a plan view parallel to the surface of the insulating member 10.

Figure 6:
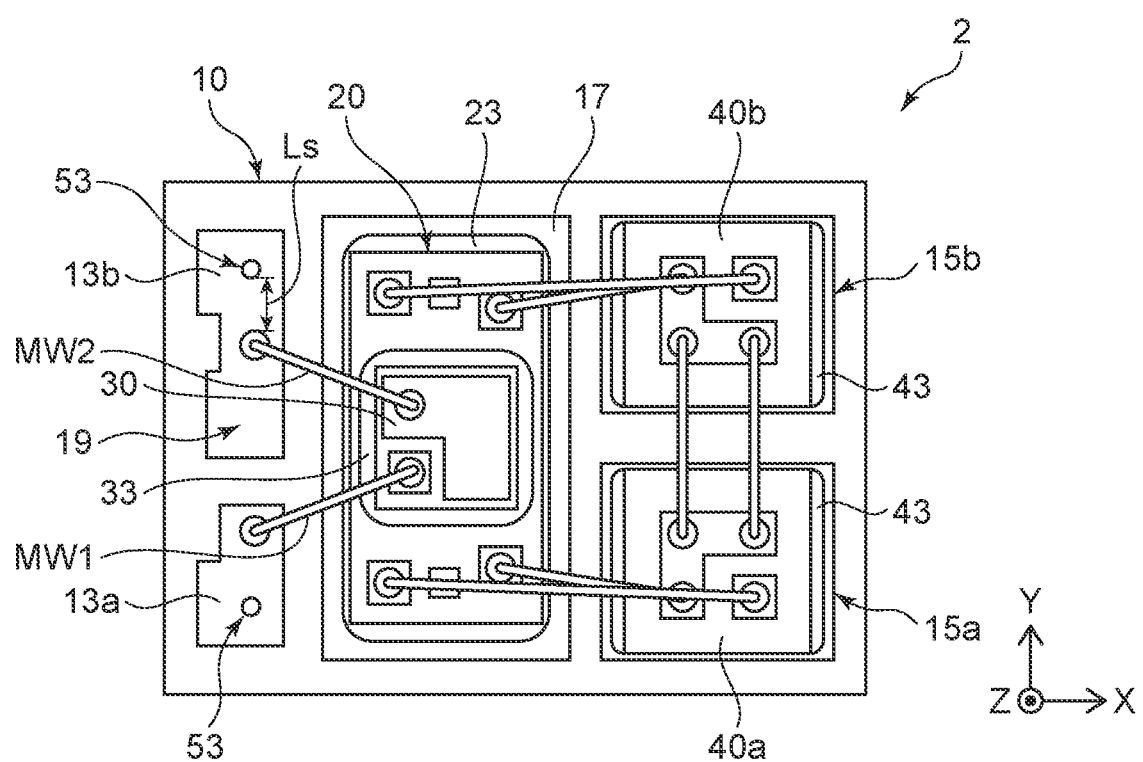
FIG. 6 is a schematic view showing a semiconductor device according to a modification of the embodiment.

FIG. 6 is a schematic view showing a semiconductor device 2 according to a modification of the embodiment. FIG. 6 is a plan view illustrating the arrangement at the front side of the insulating member 10.

In the example, the metal reflection plate 19 is linked to the bonding pad 13b and apart from the bonding pad 13a. In other words, the bonding pad 13b and the metal reflection plate 19 are formed to have a continuous body. Such a configuration is advantageous when the space between the bonding pad 13a and the bonding pad 13b is narrow and is not enough to provide the metal reflection plate 19 apart from the bonding pads 13a and 13b. The metal reflection plate 19 may be configured to be linked to the bonding pad 13a and apart from the bonding pad 13b. Thus, the bonding pad 13b has a second length longer than the first length of the bonding pad 13a. The first and second lengths are defined in a direction directed from the bonding pad 13a toward the bonding pad 13b, e.g., the Y-direction.

As shown in FIG. 6, the metal wire MW2 is bonded between the metal reflection plate 19 and the via contact 53. When a separation distance Ls from the bonding position of the metal wire MW2 to the via contact 53 is increased, the parasitic inductance between the bonding position and the via contact 53 is increased, and the frequency characteristics are degraded in the signal transmission path between the control-side terminal 50b and the light-emitting element 30.

It is also possible to irradiate the laser light LL between the via contact 53 and the bonding position of the metal wire MW2 by increasing the separation distance Ls. However, when the separation distance Ls is increased, the frequency characteristics of the signal transmission path between the control-side terminal 50b and the light-emitting element 30 are degraded, and the signal frequency on the control side is limited. Accordingly, it is preferable for the metal wire MW2 to be bonded to a position proximate to the via contact 53.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
    an insulating member having a front surface and a back surface opposite to the front surface;
    a light-receiving element provided on the front surface of the insulating member;
    a light-emitting element provided on the light-receiving element and optically coupled to the light-receiving element;
    a switching element provided on the front surface of the insulating member, the switching element and the light-receiving element being arranged along the front surface of the insulating member, the switching element being electrically connected to the light- receiving element;
    a first metal terminal provided on the back surface of the insulating member and electrically connected to the light-emitting element;
    a second metal terminal provided on the back surface of the insulating member and electrically connected to the switching element, the second metal terminal being apart from the first metal terminal;
    a metal reflection plate provided on the front surface of the insulating member, the metal reflection plate being proximate to the light-receiving element;
    a first resin member covering the light-emitting element on the light-receiving element;
    a second resin member covering the light-receiving element, the light-emitting element, the first resin member, the switching element, and the metal reflection plate on the front surface of the insulating member;

a first mount pad provided on the front surface of the insulating member;

a second mount pad provided on the front surface of the insulating member, the first mount pad and the second mount pad being arranged along the insulating member, the second mount pad being apart from the first mount pad;

a first bonding pad provided on the front surface of the insulating member and being proximate to the first mount pad, the first bonding pad being apart from the first mount pad;

a second bonding pad provided on the front surface of the insulating member and being proximate to the first mount pad, the first bonding pad and the second bonding pad being arranged along the front surface of the insulating member, the second bonding pad being apart from the first mount pad and the first bonding pad;

a first metal wire electrically connecting the first bonding pad and the light-emitting element;

a second metal wire electrically connecting the second bonding pad and the light- emitting element; and another first metal terminal provided on the back surface of the insulating member, the first metal terminal and said another first metal terminal being arranged along the back surface of the insulating member, said another first metal terminal being apart from the first metal terminal and electrically connected to the light-emitting element, the light-receiving element being mounted on the first mount pad, the switching element being mounted on the second mount pad, the first metal terminal being electrically connected to the first bonding pad, said another first metal terminal being electrically connected to the second bonding pad, the second metal terminal being electrically connected to the switching element via the second mount pad, the metal reflection plate being provided between the first bonding pad and the second bonding pad.

2. The device according to claim 1, wherein
the first metal terminal is electrically connected to the first bonding pad through a via hole provided in the insulating member, and
the second metal terminal is electrically connected to the second mount pad through another via hole provided in the insulating member.

3. The device according to claim 1, wherein
the first mount pad is provided between the second mount pad and the first bonding pad and between the second mount pad and the second bonding pad.

4. The device according to claim 1, wherein
the first mount pad is provided between the second mount pad and the metal reflection plate.

5. The device according to claim 1, wherein
the first metal wire and the second metal wire do not overlap the metal reflection plate in a direction perpendicular to the front surface of the insulating member.

6. The device according to claim 1, wherein
the metal reflection plate is apart from the first bonding pad, the second bonding pad, and the first mount pad.

7. The device according to claim 6, wherein
a first separation distance from the first mount pad to the metal reflection plate is greater than a second separation distance from the first mount pad to the first bonding pad and greater than a third separation distance from the first mount pad to the second bonding pad.

8. The device according to claim 7, wherein
the metal reflection plate is apart from the first bonding pad by a fourth separation distance,
the metal reflection plate is apart from the second bonding pad by a fifth separation distance, and
the second separation distance, the third separation distance, the fourth separation distance, and the fifth separation distance are equal.

9. The device according to claim 1, wherein
the metal reflection plate is apart from the first bonding pad and linked to the second bonding pad, and
the first bonding pad has a first length less than a second length of the second bonding pad, the first and second lengths being defined in a direction directed from the first bonding pad toward the second bonding pad.

10. The device according to claim 1, wherein
the metal reflection plate is apart from an outer edge of the insulating member.

11. The device according to claim 1, wherein
the metal reflection plate, the first bonding pad, and the second bonding pad include a same material.

12. The device according to claim 1, wherein
the metal reflection plate includes a surface of gold.

13. The device according to claim 1, wherein
the first mount pad, the second mount pad, the first bonding pad, the second bonding pad, and the metal reflection plate have a same thickness in a direction perpendicular to the front surface of the insulating member.

* * * * *